(12) United States Patent
Schliewe et al.

(10) Patent No.: US 10,749,491 B2
(45) Date of Patent: Aug. 18, 2020

(54) INDUCTIVE COMPONENT FOR A BUS BAR

(71) Applicant: EPCOS AG, Munich (DE)

(72) Inventors: Jorn Schliewe, Steinheim (DE); Stefan Schefler, Ulm (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/579,583

(22) PCT Filed: Jun. 10, 2016

(86) PCT No.: PCT/EP2016/063303
§ 371 (c)(1),
(2) Date: Dec. 4, 2017

(87) PCT Pub. No.: WO2016/206993
PCT Pub. Date: Dec. 29, 2016

(65) Prior Publication Data
US 2018/0167046 A1    Jun. 14, 2018

(30) Foreign Application Priority Data

Jun. 24, 2015 (DE) .................. 10 2015 110 142

(51) Int. Cl.
| | |
|---|---|
| H03H 1/00 | (2006.01) |
| H01F 3/14 | (2006.01) |
| H01F 17/06 | (2006.01) |
| H01F 37/00 | (2006.01) |
| H03H 7/01 | (2006.01) |

(52) U.S. Cl.
CPC ............ *H03H 1/0007* (2013.01); *H01F 3/14* (2013.01); *H01F 17/06* (2013.01); *H01F 37/00* (2013.01); *H03H 7/01* (2013.01); *H01F 2017/065* (2013.01); *H03H 2001/0028* (2013.01); *H03H 2001/0057* (2013.01)

(58) Field of Classification Search
CPC . H01F 3/14; H01F 17/04; H01F 17/06; H01F 2017/065
USPC .......................................................... 333/181
See application file for complete search history.

(56) References Cited

U.S. PATENT DOCUMENTS

| | | |
|---|---|---|
| 4,639,665 A | 1/1987 | Gary |
| 2006/0043960 A1 | 3/2006 | Itoh |
| (Continued) | | |

FOREIGN PATENT DOCUMENTS

| | | |
|---|---|---|
| DE | 102005036552 A1 | 3/2006 |
| DE | 102012104348 A1 | 11/2013 |
| (Continued) | | |

OTHER PUBLICATIONS

Lou et al., "Design of a Hybrid Busbar Filter Combining a Transmission-Line Busbar Filter and a One-Turn Inductor for DC-Fed Three-Phase Motor Drive Systems", IEEE Transactions on Power Electronics, vol. 28, No. 12, Dec. 2013, pp. 5588-5601 (Year: 2013).*

(Continued)

*Primary Examiner* — Benny T Lee
*Assistant Examiner* — Hafizur Rahman

(57) ABSTRACT

The invention specifies an inductive component for a busbar. The inductive component has two air gaps which are arranged on opposite sides of the component, wherein the air gaps are at a distance from one another in a vertical direction of the component.

16 Claims, 1 Drawing Sheet

(56) References Cited

U.S. PATENT DOCUMENTS

| | | | |
|---|---|---|---|
| 2009/0009277 A1* | 1/2009 | Sodo | H01F 3/10 336/110 |
| 2010/0013587 A1 | 1/2010 | Yan et al. | |
| 2010/0033284 A1 | 2/2010 | Yamakami et al. | |
| 2010/0171580 A1 | 7/2010 | Abe et al. | |
| 2012/0153857 A1 | 6/2012 | Han et al. | |
| 2013/0154766 A1* | 6/2013 | Beck | H03H 1/0007 333/182 |

FOREIGN PATENT DOCUMENTS

| | | | |
|---|---|---|---|
| EP | 0133695 A1 | 3/1985 | |
| EP | 2669911 A1 | 12/2013 | |
| EP | 2800218 A1 | 11/2014 | |
| GB | 2442090 A | 3/2008 | |
| JP | H0362602 A | 3/1991 | |
| JP | H058917 U | 2/1993 | |
| JP | 2007-162890 A | 6/2007 | |
| JP | 2009 071248 A | 4/2009 | |
| JP | 2010-062295 A | 3/2010 | |
| JP | 2010-224204 A | 10/2010 | |
| JP | 2010-0538494 A | 12/2010 | |
| WO | WO 2009/123433 A1 | 10/2009 | |
| WO | 2011/136232 A1 | 3/2011 | |
| WO | WO 2012/120367 A1 | 9/2012 | |

OTHER PUBLICATIONS

TDK-Lambda UK, "Are EMI and EMC filters the same thing?" first available on https://uk.tdk-lambda.com/faq/ on Dec. 8, 2014 according Internet Archive way back machine. (Year: 2014).*

Radius Power, Inc., "EMI Filters, RFI Filters, EMC Filters", first available on www.radiuspower.com/emi-filters on Aug. 22, 2012 according to Internet Archive way back machine. (Year: 2012).*

"Air gapped magnetic cores", Workshop of Technical Service Unit, EEE, University of Surrey, Guildford, Surrey GU2 7XH, United Kingdom, first available on http://info.ee.surrey.ac.uk/Workshop/advice/coils/gap/ on Dec. 23, 2008 according to Internet Archive Way back Mach (Year: 2008).*

Zhenyang et al. ("The Reviews of Integrated EMI Filters Applied in Power Electronic System", May 26-29, 2015 Asia-Pacific Symposium on Electromagnetic Compatibility (APEMC), pp. 227-230 (Year: 2015).*

* cited by examiner

INDUCTIVE COMPONENT FOR A BUS BAR

RELATED APPLICATIONS/PRIORITY CLAIMS

This application is a 371 U.S. national stage filing of and claims the benefit and priority under 35 U.S.C. §§ 119, 120, 364 and 365 to PCT/EP2016/063303, filed on Jun. 10, 2016, that in turn claims priority under 35 USC 119 and 120 to German Application No. 102015110142.4 dated Jun. 24, 2015, the entirety of all of which are incorporated herein by reference.

FIELD OF THE DISCLOSURE

The invention specifies an inductive component for a busbar. The inductive component is used, in particular, for filtering interference phenomena, in particular radiofrequency interference phenomena, in the busbar.

SUMMARY

One object of the present invention is to specify an improved inductive component for a busbar.

A first aspect of the present invention specifies an inductive component for a busbar. The inductive component is designed, in particular, to lead the busbar through the component. Said busbar is preferably a copper busbar. The busbar is designed, for example, to conduct the current in a converter. The inductive component serves, for example, to filter radiofrequency interference phenomena in a low-frequency useful signal.

The inductive component has two air gaps. The air gaps are preferably arranged on opposite sides of the component. By way of example, the component has an opening for leading the busbar through. The air gaps are preferably located on sides of the component between which the opening is situated. When a busbar is lead through the component, the air gaps are correspondingly arranged on opposite sides of the busbar.

The air gaps are preferably at a distance from one another in a vertical direction of the component. In this case, the vertical direction is a direction perpendicular to the extension of the busbar, that is to say perpendicular to the direction of flow of the current through the busbar. The vertical direction preferably runs parallel to the opposite sides of the component on which the air gaps are arranged. Therefore, the air gaps are arranged at different heights of the component, in particular arranged in a manner offset in relation to one another. The air gaps are preferably at the same distance from half the height of the component. By way of example, the first air gap is arranged beneath half the height of the component and the second air gap is arranged above half the height of the component.

The losses in the busbar can preferably be reduced owing to the air gaps being arranged at a distance from each other. In particular, a more homogeneous current density distribution in the busbar can be achieved. In this case, this effect can preferably be achieved without increasing the size of the component or increasing the costs.

The inductive component has, for example, two component elements. Said component elements are, in particular, two cores composed of soft-magnetic material, for example ferrite. The air gaps are preferably arranged between the cores. By way of example, the cores have the same shape.

In one embodiment, each of the cores has a first limb and a second limb, wherein the first limb has a different length to the second limb. By way of example, each core has precisely two limbs. The limbs of each core are preferably connected to one another by a connecting piece. The cores each have, for example, the shape of a "U" core or of a "C" core with limbs of different lengths.

By way of example, the first air gap is arranged between the first limb of the first core and the second limb of the second core, and the second air gap is arranged between the second limb of the first core and the first limb of the second core. The air gaps are preferably arranged in a manner offset in relation to one another with respect to a direction which extends from the connecting piece to the free end of the limb.

In one embodiment, the distance between the air gaps in the vertical direction is at least ¼ of the sum of the lengths of a first limb, of a second limb and of the height of the air gap. The opening for leading the busbar through is preferably laterally bounded by a first limb, the air gap and the second limb. The height of the opening is then preferably identical to the sum of the lengths of the first limb, of the second limb and of the height of the air gap. Therefore, the distance between the air gaps in the vertical direction is at least ¼ of the height of the opening. Given a distance of this kind between the air gaps, the losses in the busbar can be reduced by up to 50%.

In one embodiment, the distance between the air gaps in the vertical direction is at most ¾ of the sum of the lengths of a first limb, of a second limb and of the height of an air gap. Accordingly, the distance between the air gaps in the vertical direction is at most ¾ of the height of the opening. Given positioning of the air gaps close to the connecting piece, the losses in the busbar can increase again. Therefore, it is expedient not to provide the air gaps too close to the connecting piece. The distance of the air gaps from the upper end and, respectively, from the lower end of the opening is preferably at least ⅛ of the height of the opening. In one embodiment, the air gaps are arranged at a distance of at least 10 mm, for example at a distance of 12.5 mm, from the upper and lower end of the opening.

By way of example, the distance between the air gaps in the vertical direction is in a range of between ¼ of the height of the opening and ¾ of the height of the opening. In particular, the distance can be approximately ½ of the height of the opening.

In one embodiment, the component is of point-symmetrical design. In particular, the component is designed to be symmetrical with respect to a rotation through 180° about an axis, wherein the axis runs centrally through the opening and in the direction of the current flow. In this way, the same core shape can be used for both halves.

A further aspect of the present invention specifies a core for an inductive component. The core has two limbs which are designed with different lengths. In particular, the core has precisely two limbs. The core is designed, for example, as a "U core" or a "C core" with limbs of different lengths. The core is particularly suitable for the above-described component and can have all of the structural and functional properties described in relation to said component.

A first aspect of the present invention specifies an inductive component which has the above-described core with two limbs of different lengths. The component preferably has two cores of this kind. The cores are arranged, for example, in such a way that the component has an opening for a busbar. The opening is preferably laterally bounded in each case by a first limb of one of the cores and a second limb of the other core. At the top and bottom, the opening is preferably bounded by in each case one connecting piece of a core. The inductive component can have all of the structural and functional properties of the above-described component. In particular, the component can have two air gaps which are offset in relation to one another in respect of their height.

A further aspect of the present invention specifies an arrangement having an inductive component and a busbar. The busbar is led through the inductive component. In particular, the inductive component of the arrangement is one of the above-described inductive components.

By way of example, the component of the arrangement has two air gaps. The air gaps are preferably arranged on opposite sides of the busbar. By way of example, said opposite sides are longitudinal sides of the busbar. By way of example, the busbar has a rectangular shape in cross section, that is to say perpendicular to a direction of flow of the current. In particular, the busbar has two longitudinal sides and two face sides. The height of the longitudinal sides is preferably greater than the width of the face sides.

The inductive component is designed, for example, for use in an EMC filter, where EMC stands for "electromagnetic compatibility". In one application example, said EMC filter is an input filter for a converter.

The present disclosure describes several aspects of an invention. All of the properties which are described with respect to the inductive component, the core and/or the arrangement are also disclosed correspondingly with respect to the respective other aspects, even if the respective property is not mentioned explicitly in the context of the respective aspect.

Hereinbelow, the subjects described here will be explained in more detail with reference to schematic exemplary embodiments which are not true to scale.

BRIEF DESCRIPTION OF THE DRAWINGS

Identical reference signs in the figures which follow preferably refer to functionally or structurally corresponding parts of the various embodiments.

DETAILED DESCRIPTION OF ONE OR MORE EMBODIMENTS

Figure 1A:
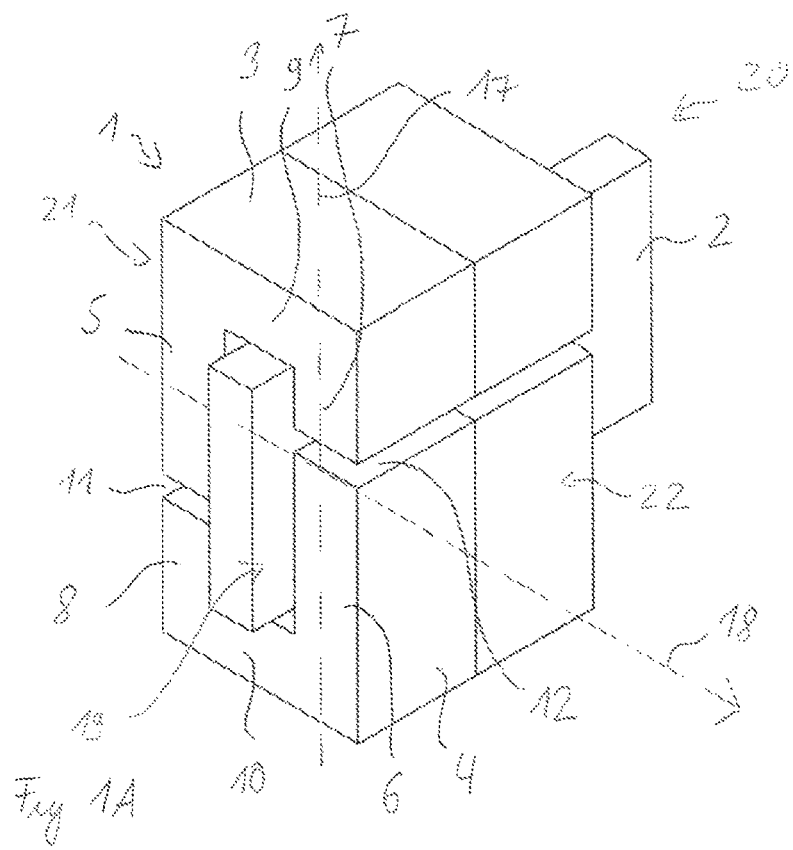
FIG. 1A shows a perspective view of an embodiment of an arrangement of an inductive component and a busbar.
Figure 1B:
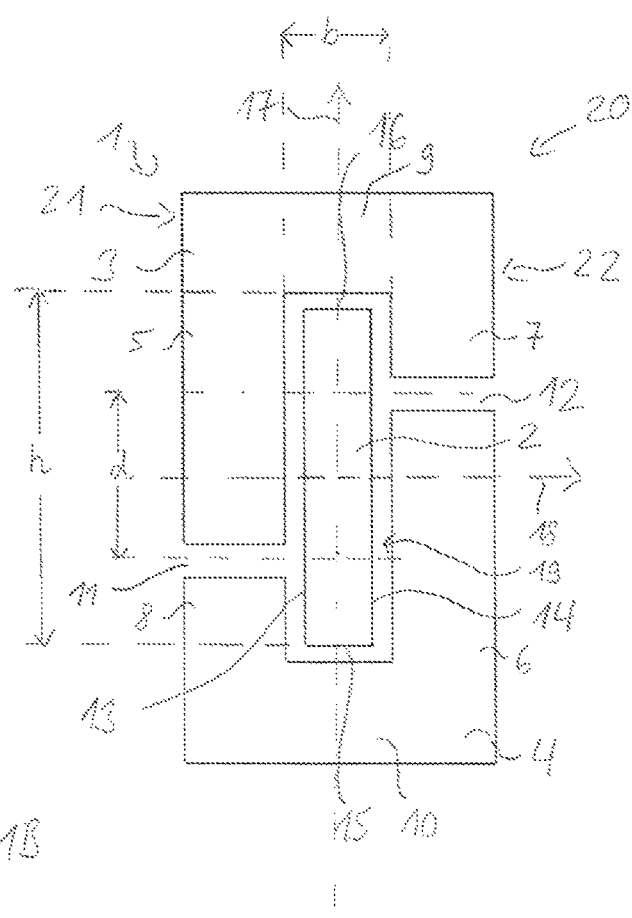
FIG. 1B shows a sectional view of the embodiment according to FIG. 1A.

FIG. 1A shows a perspective view of an arrangement 20 of an inductive component 1 and a busbar 2. FIG. 1B shows the arrangement 20 in cross section.

The busbar 2 is composed of copper for example. The busbar 2 is preferably suitable for conducting large currents. By way of example, the busbar 2 is used for conducting the current in a converter. The converter serves, for example, to supply power to electrical machines, in particular motors.

The inductive component 1 is used, for example, in an EMC filter, that is to say in a filter for achieving electromagnetic compatibility (EMC). Said filter is, in particular, a busbar filter. By way of example, a filter of this kind has a plurality of interconnected inductors and capacitors on a plurality of busbars. The filter preferably serves to filter radiofrequency interference phenomena in a low-frequency useful signal. By way of example, the useful signal has a frequency of approximately 50 Hz. The filter is particularly suitable for differential-mode interference phenomena.

The inductive component 1 has two component elements. The component elements are designed as cores 3, 4, in particular as magnetic cores. Said cores are, for example, ferrite cores. Each core 3, 4 has a first limb 5, 6 and a second limb 7, 8, which limbs are respectively connected to one another by a connecting piece 9, 10 of the cores 3, 4. The cores 3, 4 are arranged in such a way that the inductive component 1 has two air gaps 11, 12. By way of example, each of the cores 3, 4 are of integral design, for example pressed as one part. However, the cores 3, 4 can also be composed of individual cores, for example I-shaped cores.

The inductive component 1 can have a plurality of such arrangements of cores 3, 4. In the present case, two further cores 23, 24, which are designed like the cores 3, 4, are arranged behind the cores 3, 4.

In particular, a first air gap 11 is arranged between the first limb 5 of the first core 3 and the second limb 8 of the second core 4, and a second air gap 12 is arranged between the second limb 7 of the first core 3 and the first limb 6 of the second core 4. The inductive component 1 preferably has precisely two air gaps 11, 12. The air gaps 11, 12 ensure the saturation resistance of the inductive component 1, that is to say they prevent the component 1 from becoming saturated.

The inductive component 1 has the shape of a rectangular core. The inductive component 1 can also have rounded corners. The inductive component 1 has an opening 19 for leading the busbar 2 through. The opening 19 has a height h and a width b (see FIG. 1B). In this case, the height h is made up of the length of a first limb 5, 6, the length of a second limb 7, 8 and the height of an air gap 11, 12.

The inductive component 1 encloses the busbar 2. The busbar 2 has a rectangular cross-sectional geometry. In particular, the busbar 2 has in each case two longitudinal sides 13, 14 which are situated opposite one another and two face sides 15, 16 which are situated opposite one another. The height of the longitudinal sides 13, 14 is somewhat smaller than the height h of the opening. The width of the face sides 15, 16 is somewhat smaller than the width b of the opening.

By way of example, the busbar has dimensions of 50 mm×10 mm, the inductive component has dimensions of 85 mm×46 mm, the opening has dimensions of 55 mm×16 mm, and the gap has a dimension of 5 mm. The current is, for example, 1600 A in use. The reduction in losses in the inductive component is, for example, 28%, this corresponding to a reduction in losses in the overall filter of approximately 10%.

The inductive component 1 is preferably of point-symmetrical design. In particular, the inductive component 1 is of symmetrical design with respect to a rotation through 180° about an axis which runs along the current direction and centrally through the opening. The cores 3, 4 have, for example, an identical geometry.

The air gaps 11, 12 are located on opposite sides 21, 22 of the component 1. Accordingly, the air gaps 11, 12 are located on opposite sides of the busbar 2, in particular on opposite longitudinal sides 13, 14 of the busbar 2. The air gaps 11, 12 are located, in particular, only on the longitudinal sides 13, 14 of the busbar 2 and not on the face sides of the busbar 2. Accordingly, the inductive component 1 has longitudinal sides and face sides, wherein the air gaps 11, 12 are located only on the longitudinal sides of the component 1. The face sides do not have any air gaps.

The air gaps 11, 12 are arranged in a manner offset in relation to one another in respect of their height. The vertical direction 17 is a direction perpendicular to the extension of the busbar 2. The vertical direction 17 runs parallel to the sides 21, 22 of the component 1 on which the air gaps 11, 12 are arranged. The width direction 18 runs perpendicular to the current direction in the busbar 2 and perpendicular to the vertical direction 17.

In particular, the air gaps 11, 12 are arranged in an asymmetrical manner with respect to mirroring on a central plane through the busbar 2. The central plane is a plane which runs between the longitudinal sides 13, 14 and parallel to the longitudinal sides 13, 14. In particular, the air gaps 11, 12 are not located at the same height on the longitudinal sides 13, 14.

By way of example, the first air gap 11 is situated in a region below half the height of the longitudinal side 13. The second air gap 12 is situated, for example, in a region above half the height of the longitudinal side 14. Therefore, neither air gap 11, 12 is arranged centrally with respect to the respective longitudinal side 13, 14.

The opening 19 has, for example, a height h of 55 mm. the air gaps 11, 12 are, for example, at a distance d of 25 mm in the vertical direction 17. This distance d is also referred to as the gap displacement in the text which follows. The air gaps 11, 12 have, for example, a height of 5 mm. Therefore, the first limbs 5, 6 are at a distance of 5 mm from the second limbs 7, 8 in each case. The cores 3, 4 are, for example, each designed as U cores or C cores with limbs 5, 6, 7, 8 of different lengths.

Owing to a gap displacement between the air gaps 11, 12, a more homogeneous current distribution can be achieved in the busbars 2 than in the case of air gaps which do not have any gap displacement. In the case of components without gap displacement, the air gaps 11, 12 are located centrally next to the busbar, in particular at half the height of the longitudinal sides, on both sides. An inhomogeneous current distribution is based on frequency-dependent current displacement effects. These current displacement effects can play a significant role even at low frequencies, for example at 50 Hz, and lead to undesired losses in the busbar 2. In particular, a high current density occurs in the region of the air gaps, which current density decreases at the top and at the bottom, in the case of symmetrically arranged air gaps.

Losses of this kind are usually reduced by increasing the size of the cross section of the busbar 2 or improved heat dissipation. However, both approaches lead to an increase in the volume and/or an increase in the costs of the arrangement 20. The losses can be reduced without increasing the volume or increasing costs by virtue of displacing the air gaps 11, 12 in relation to one another. In particular, when the air gaps are displaced, the current density in the busbar is considerably more homogeneous than in the case of air gaps which are arranged at the same height.

It has been found, for example, that in the case of an opening with a height of 50 mm and a busbar 2 of a similar height, a gap displacement of 5 mm already leads to a reduction in losses of approximately 1%. The losses could be reduced by 10% with a gap displacement of 25 mm. With further displacement of the air gaps in the direction of the edge of the cores 3, 4, that is to say in the direction of the connecting pieces 9, 10, the losses increase again since the inductive effect is increased at the edge. An optimum region for the distance between the air gaps is situated, in particular, in a region around half the height of the opening or the busbar, for example in a region of 0.25·h to 0.7·h. The losses in the inductive component could be reduced by more than 20% with gap displacements of this kind.

The invention claimed is:

1. An arrangement comprising an inductive component and a busbar lead extending through the inductive component, the inductive component having two air gaps which are arranged on opposite sides of the component, wherein the air gaps are at a distance from one another in a vertical direction to reduce the losses in the busbar.

2. The arrangement according to claim 1, the inductive component having two cores, wherein each core has a first limb and a second limb, wherein the first limb has a different length as compared to the second limb.

3. The arrangement according to claim 2, in which the air gaps are located between the cores.

4. The arrangement according to claim 2, in which a first air gap of the two air gaps is arranged between the first limb of the first core and the second limb of the second core, and a second air gap of the two air gaps is arranged between the second limb of the first core and the first limb of the second core.

5. The arrangement according to claim 2, in which the inductive component has an opening through which the busbar extends, wherein the distance between the first air gap and the second air gap in the vertical direction is at least ¼ of a height of the opening in the horizontal direction.

6. The arrangement according to claim 2, in which the inductive component has an opening through which the busbar extends, wherein the distance between the first air gap and the second air gap in the vertical direction is at most ¾ of a height of the opening in the horizontal direction.

7. The arrangement according to claim 2, in which the cores have the same shape.

8. The arrangement according to claim 2, in which at least one of the cores has the shape of a "U" core or of a "C" core, wherein the first limb has a different length than the second limb.

9. The arrangement according to claim 8, in which the two cores have the shape of a "U" core or of a "C" core with limbs of different lengths, wherein each of the air gaps adjoins both cores.

10. The arrangement according to claim 1, in which the inductive component has an opening through which the busbar extends, wherein the inductive component is of point-symmetrical design such that the inductive component is symmetrical with respect to a rotation of 180° about an axis running centrally through the opening in the direction of the busbar.

11. The arrangement according to claim 1, wherein the inductive component has not more than the two air gaps.

12. The arrangement according to claim 1, wherein the inductive component has longitudinal sides and face sides, wherein the extension of each of the longitudinal sides is larger than the extension of each of the face sides, wherein the air gaps are located only on longitudinal sides and wherein the face sides are free from any air gaps.

13. The arrangement according to claim 1, in which the opposite sides are longitudinal sides of the busbar.

14. The arrangement according to claim 1, which is designed to filter radiofrequency interference phenomena.

15. The arrangement according to claim 14, in which the inductive component is designed for an EMC filter.

16. The arrangement according to claim 14, in which the busbar is designed for use as an input filter element in a converter for electric drives.

* * * * *